United States Patent
Crippen et al.

(10) Patent No.: US 6,889,908 B2
(45) Date of Patent: May 10, 2005

(54) THERMAL ANALYSIS IN A DATA PROCESSING SYSTEM

(75) Inventors: Martin Joseph Crippen, Apex, NC (US); Jason Aaron Matteson, Raleigh, NC (US); William Joseph Piazza, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 10/610,303

(22) Filed: Jun. 30, 2003

(65) Prior Publication Data

US 2004/0262409 A1 Dec. 30, 2004

(51) Int. Cl.⁷ .................................................. F24F 7/00
(52) U.S. Cl. .................... 236/49.3; 62/178; 62/259.2; 361/696
(58) Field of Search ..................... 62/259.2, 89, 178, 62/186, 209; 236/49.3; 454/184; 361/691, 695, 696

(56) References Cited

U.S. PATENT DOCUMENTS

| | | |
|---|---|---|
| 4,527,231 A | 7/1985 | Aucel et al. |
| 4,817,865 A | 4/1989 | Wray |
| 5,197,666 A | 3/1993 | Wedekind |
| 5,410,448 A | 4/1995 | Barker, III et al. |
| 5,471,099 A | 11/1995 | Larabell et al. |
| 5,491,610 A | 2/1996 | Mok et al. |
| 5,623,834 A | 4/1997 | Bahel et al. |
| 5,904,478 A | 5/1999 | Weaver et al. |
| 6,082,623 A * | 7/2000 | Chang ........................ 236/49.3 |
| 6,188,189 B1 | 2/2001 | Blake |
| 6,198,245 B1 | 3/2001 | Du et al. |
| 6,280,317 B1 * | 8/2001 | Przilas et al. ................ 454/184 |
| 6,356,444 B1 * | 3/2002 | Pedoeem ..................... 361/692 |
| 6,535,382 B2 * | 3/2003 | Bishop et al. ............... 361/690 |
| 6,628,520 B2 * | 9/2003 | Patel et al. .................. 361/696 |
| 6,639,794 B2 * | 10/2003 | Olarig et al. ................ 361/687 |
| 6,707,669 B2 * | 3/2004 | Lee ............................. 361/688 |

* cited by examiner

Primary Examiner—Marc Norman
(74) Attorney, Agent, or Firm—Lally & Lally, LLP

(57) ABSTRACT

Methods, systems, and media for thermal analysis are disclosed. Embodiments of the invention receive temperatures associated with elements of a system. The temperatures received are dependant upon airflow and heating patterns of the elements. Differences between the temperatures received and expected temperatures are detected. Potential airflow and heating patterns associated with a thermal problem are then determined, the potential airflow and heating patterns being substantially consistent with the temperatures received, to identify a root cause of the thermal problem as a probable source of the differences. More specifically, embodiments collect temperature readings from temperature sensors within an enclosure of the system; identify and upward temperature gradient or temperature that exceeds a threshold temperature; and select a failure scenario associated with a root cause of a thermal problem that is similar to the thermal problem described by the temperature readings collected.

24 Claims, 6 Drawing Sheets

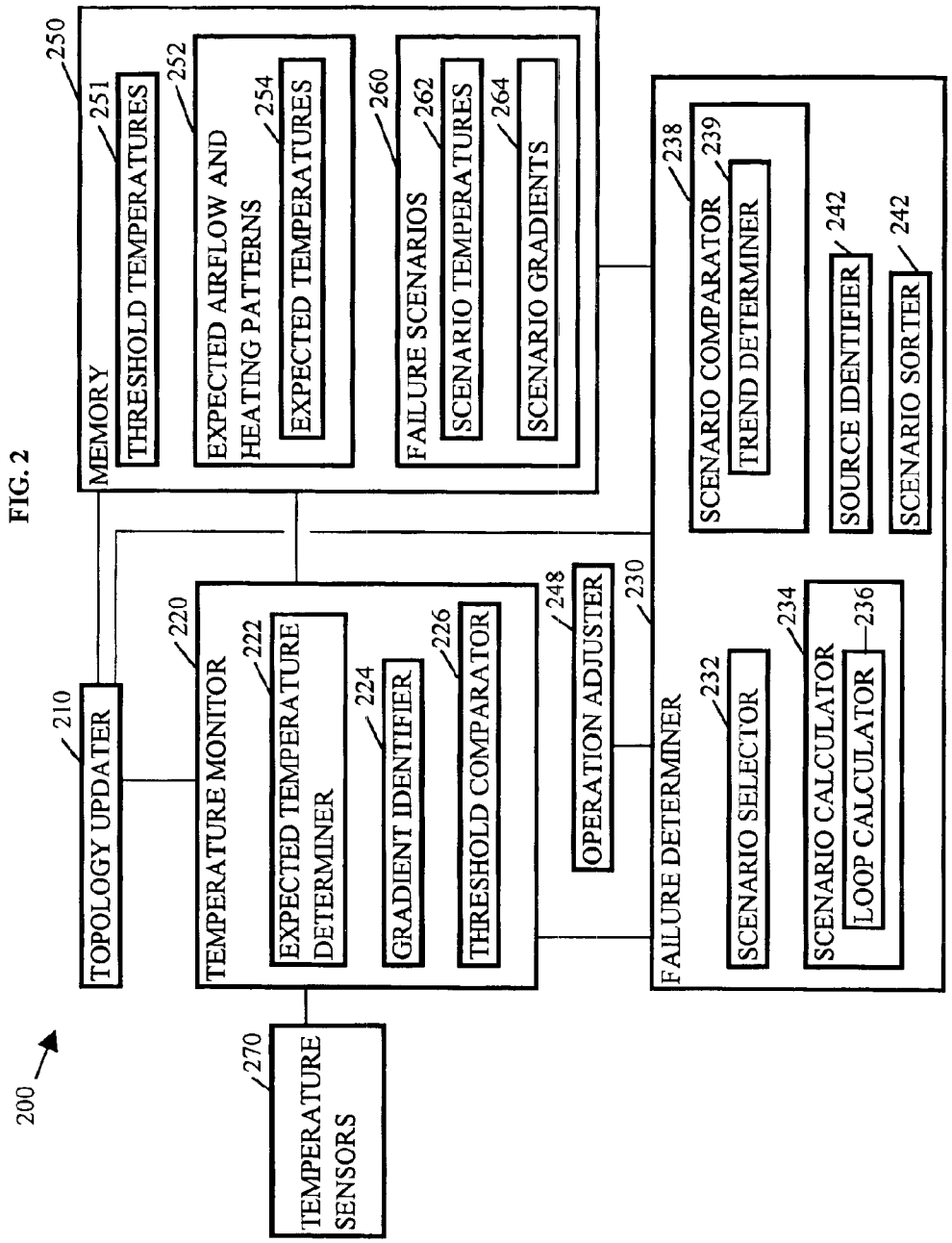

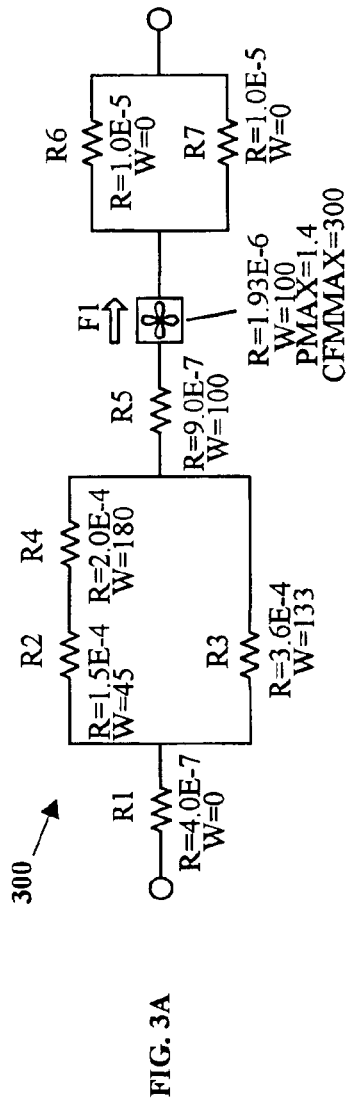
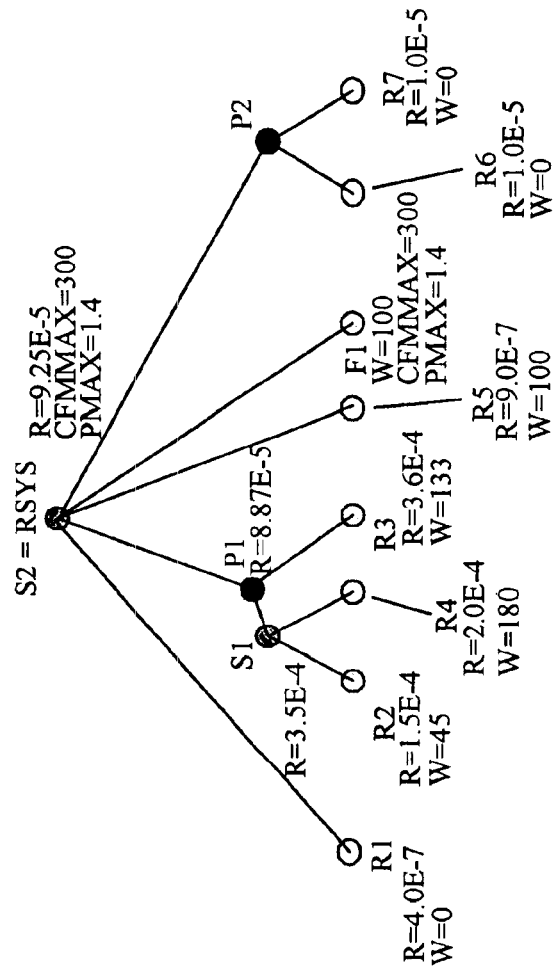
FIG. 3A
FIG. 3B

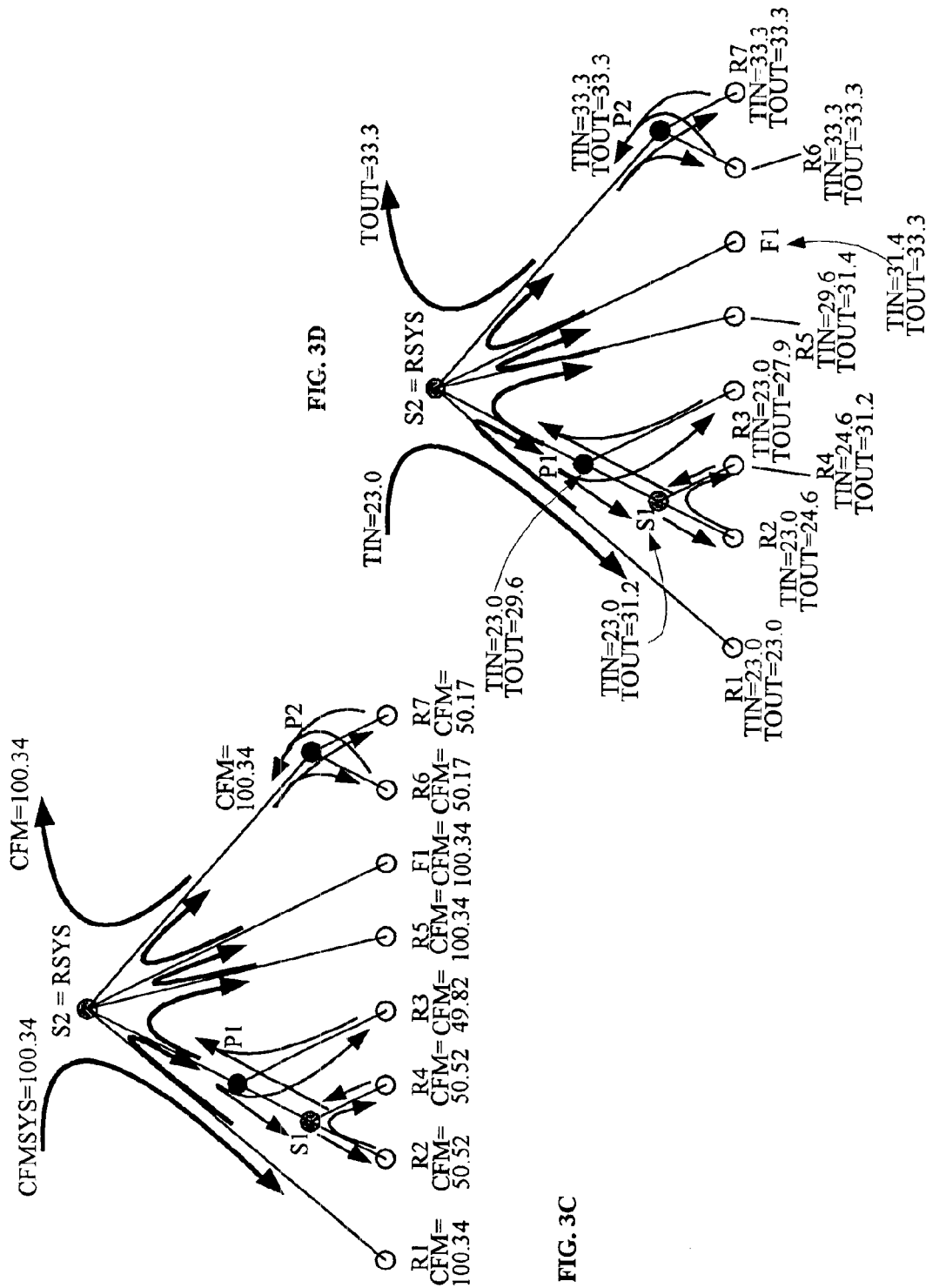

THERMAL ANALYSIS IN A DATA PROCESSING SYSTEM

FIELD OF INVENTION

The present invention relates to the field of data processing systems and more particularly to methods and systems for handling thermal energy generated by data processing systems.

BACKGROUND

Many organizations have begun consolidating servers into centralized data centers, looking to use physical, application or data consolidation as a means of reducing the challenges and costs associated with administering many small servers scattered across the enterprise. To date, physical consolidation has generally involved replacing bulky tower servers with slender 1U or 2U rack systems. The slender rack systems take less space and put the servers and infrastructure within easy reach of the administrator, rather than spread across a large campus. These systems enable organizations to reap many benefits of consolidation, however each server requires its own infrastructure including cables for power, Ethernet, systems management, power distribution units (PDUs), keyboard/video/mouse (KVM) switches and Fibre Channel switches, which offer challenges of their own. For instance, a rack of 42 1U servers can have hundreds of cables strung throughout the rack, making it difficult to determine which cables attach where and complicating the installation and removal of servers from the rack. Further, the PDUs and switches consume valuable rack sidewall space.

The trend has led to even more compact server arrangements such as blade servers. A blade server, e.g., IBM eServer BladeCenter, is a type of rack-optimized server that eliminates many of these complications, thus providing an effective alternative to 1U and 2U servers. Blade server designs range from ultra-dense, low-voltage, lesser-performing servers to high-performance, lower density servers to proprietary, customized rack solutions that include some blade features.

The term "blade server" refers to an enclosure that can hold a number of hot-swappable devices called blades. Blades come in two varieties: server blades and option blades. A server blade is an independent server, containing one or more processors with associated memory, disk storage and network controllers, which runs its own operating system and applications. Each server blade within a system enclosure slides into a blade bay and plugs into a mid-plane or backplane to share common infrastructure elements, such as power supplies, fans, CD-ROM and floppy drives, Ethernet and Fibre Channel switches and system ports. Option blades, which may be shareable by the server blades, provide additional features, such as controllers for external I/O or disk arrays, additional power supplies, etc.

The compactness of systems like blade servers forces otherwise independent servers to share a thermal profile with hardware resources, including enclosures, power supplies, fans, and management hardware, causing power consumption and cooling to become much more critical. Because of the large number of elements housed within blade servers, the airflow and heating patterns within the blade servers are fairly complicated and many possible sources of thermal problems can exist, exacerbating the detrimental effects and maintenance involved with thermal crises and thermal problems that can lead to thermal crises.

A thermal crisis is a situation where a monitored temperature within a thermal system like an enclosure of an electronic system or an element in the electronic system has reached a critical threshold beyond which the equipment should not be operated. A thermal crisis may result from a number of different situations, among them are overheating of an electrical component within the enclosure; partial or total failure of a cooling fan within the enclosure; failure of the room heating, ventilation, and air conditioning (HVAC) equipment; inadequate cooling in the facility (e.g., overcrowded machine room); airflow blocked by an outside obstruction (e.g., close proximity to a wall or materials draped in front of air intakes); removal (without replacement) of an enclosure panel or subsystem (resulting in redirected airflow within the enclosure); and over-configuration (i.e., violation of enclosure specifications regarding limitations for some configurations).

To prevent damage to the electronic system, it is a common practice in the industry to provide internal temperature monitoring and to implement a dual-level threshold scheme to recognize a thermal problem before it develops into a thermal crisis. When a temperature reading is seen to cross a first threshold (e.g., 55° C.) a warning message is generated to notify the operator. The electronic system will often shut down if any sensor reading crosses the second (error) threshold (e.g., 65° C.). In the present state of the art, a major component near the sensor producing an unacceptable reading is assumed to be responsible for the situation and no effort is made to isolate the problem to one of the root causes listed above. It would be desirable to implement a mechanism by which the sensor data is analyzed in the event of an over temperature condition to optimize the response taken.

SUMMARY OF THE INVENTION

The goal described above is achieved by a method and system for thermal analysis according to the present invention. Embodiments of the invention may receive temperatures associated with elements of a system, wherein the temperatures received are dependent upon airflow and heating patterns of the elements; detect a difference between the temperatures received and expected temperatures; and determine potential airflow and heating patterns associated with an element of the system, the potential airflow and heating patterns being substantially consistent with the temperatures received, to identify the element as a probable source of the difference. More specifically, embodiments may collect temperature readings from temperature sensors within an enclosure of the system; identify an upward temperature gradient or temperature that exceeds a threshold temperature; and select a failure scenario associated with a root cause of a thermal problem that is similar to the thermal problem described by the temperature readings collected. Many embodiments may determine a failure scenario based upon a topology of the system; calculate the potential airflow and heating patterns for the failure scenario, e.g., by calculating the potential airflow and heating patterns based upon an airflow loop via an opening associated with the element; and compare temperatures associated with the potential airflow and heating patterns with the temperatures received. Some embodiments may also adjust an operation of the system to modify a temperature gradient of the system in response to determining the potential airflow and heating patterns for the element by determining a trend associated with the temperatures received and comparing temperatures associated with the trend with the temperatures received.

BRIEF DESCRIPTION OF THE DRAWINGS

Other objects and advantages of the invention will become apparent upon reading the following detailed description and upon reference to the accompanying drawings in which, like references may indicate similar elements:

FIG. 2 depicts an embodiment of an apparatus for thermal analysis of a system such as the system in FIG. 1;

FIGS. 3A–D depict an embodiment of a model and a data structure for thermal analysis of a system for FIG. 2;

DETAILED DESCRIPTION OF EMBODIMENTS

Figure 1:
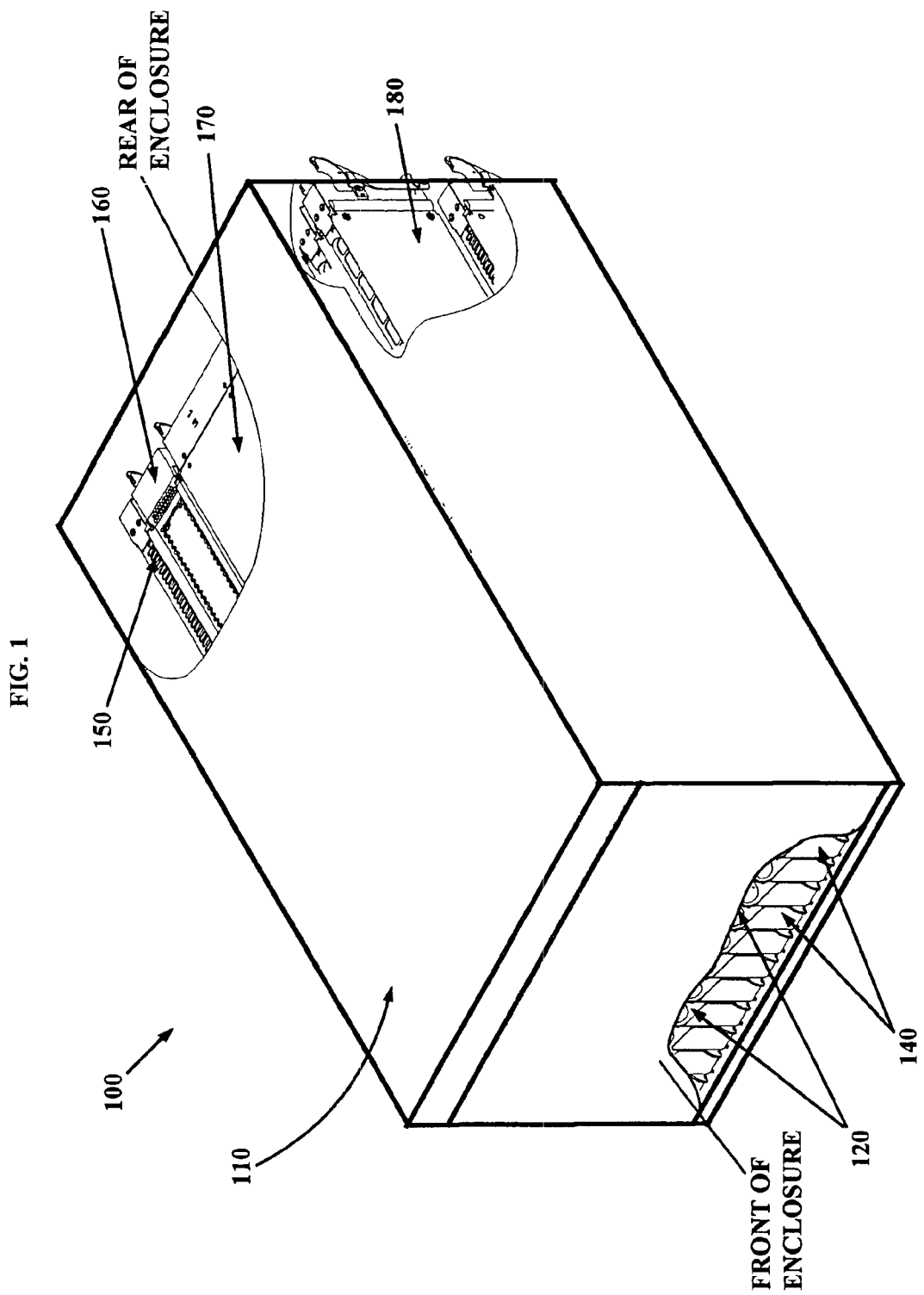
FIG. 1 depicts an embodiment of a blade server type system having servers with vents and a blower in an enclosure to mount in a server rack.

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, automated, user-friendly methods, systems, and media for thermal analysis of an electronic system are contemplated. The electronic system includes a number of elements having interrelated airflow and heating patterns. In particular, the elements may be servers, power supplies, blowers, switches, management controller, panels and the ventilation pathways thereof, in an enclosure. Each module may produce a heating pattern based upon the operations performed by the module and the vents of each module and of the enclosure may be interconnected in series and/or in parallel to remove heat from the enclosure. When a thermal problem develops, embodiments of the invention may detect the problem via a set of temperature sensors distributed throughout the enclosure, analyze the thermal problem by comparing the temperatures in the enclosure to failure scenarios that describe potential deviations in airflow and heating patterns associated with various potential root causes, and identify a root cause of the most similar failure scenario(s) as a probable source of the difference before a thermal crisis develops. Some embodiments may also take corrective actions based upon the probable source identified for the thermal problem. For example, if an empty space is left in the enclosure or a vent is blocked, a portion of the air may be redirected or blocked and may not flow as quickly in some parts of the system, failing to remove some or all of the heat dissipated from elements of the enclosure.

Embodiments may also take into account the topology of the system, or the contemporaneous distribution of elements in the enclosure, and potential sources of variation of the airflow and heating patterns to determine the probable source of a deviant heating pattern. For example, when it is known at the time the warning is sent that a side panel has been removed from the enclosure (leaving an opening that alters the airflow within the enclosure), then a hardware technician could be dispatched and given explicit instruction on how to correct the problem. When it was known that the problem is caused by blocked airflow to a set of processor blades in a, e.g., BladeCenter environment, then embodiments can automatically reassign workload to unaffected processor blades. When the source is localized to a particular element that is overheating, then the problematic element can be varied off line. Then, the probable source is reported to a service provider via an alarm, a message via a display, an email, a printout, or other format.

In the following discussions, the term "loop" may be used to describe certain airflow paths. Technically speaking, air does not flow in a loop but flows from the highest pressure to the lowest pressure. "Loop" refers to a topological configuration of the airflow paths such that air may flow along either of two paths to get from one point in the system to another and, depending upon the state of other portions of the configuration, air in one portion of the loop may actually reverse directions for some system configurations.

Turning now to the drawings, FIG. 1 depicts an embodiment of a system 100 for thermal analysis. System 100 may be a blade server to support a high spatial density of servers like servers 120 and provide cost-effective, extremely manageable, high-density rack servers. System 100 includes an enclosure 110, servers 120, vents 140, a management controller module 150, a power module 160, a blower 170, and a switch module 180. Enclosure 110 may house multiple servers 120 sharing common management controllers, power modules, switch modules, blowers, and switch modules to reduce the number of potential component failures and the physical distribution of such support equipment. In many embodiments, connectors for servers 120 may couple servers 120 with the support modules to reduce wiring requirements and facilitate installation and removal of servers 120. For instance, each of servers 120 may couple with a gigabit Ethernet network via switch module 180. Advantageously, enclosure 110 may couple servers 120 to the Ethernet network without connecting cables directly to each server.

Enclosure 110 may also provide for hot-swappable units, allowing, e.g., a server to be installed in an empty slot like empty server slots while servers 120 continue to function and temperature sensors coupled with management controller 150 may monitor temperatures throughout enclosure 110. In other embodiments, each element may include temperature sensors coupled with management controller 150 via enclosure 110 to monitor temperatures throughout the enclosure. In several embodiments, enclosure 110 also includes one or more disc drives, hard drives, compact disc (CD) drives, and digital versatile disc (DVD) drives to couple with the servers. The drives may facilitate installation of operating systems and other applications on the servers 120.

Servers 120 may include single or multi-processor servers having hard drives and memory to service one or more common or independent networks. In the present embodiment, servers 120 include hot-swappable blade servers. Servers 120 include vents 140 to facilitate forced air intake and exhaust to remove heat produced by components of the server like processors. In particular, blower 170 may draw air from the front of enclosure, through servers 120, and exhaust the air through the back of blower 170 or the back of enclosure.

Management controller 150 may include thermal analysis software, firmware and or state machines to analyze temperatures detected throughout enclosure 110 for detecting thermal problems and avoiding or attenuating thermal crises, and may include memory to store data describing the topology of system 100. In particular, management controller 150 maintains the topology of system 100 like the element content, interconnection of air paths between elements, and attributes of each element, including, e.g., the airflow impedances of elements such as servers 120, empty server slots, vents 140, management module 150, power module 160, blower 170, and switch module 180 and the characteristic curve of blower 170.

Airflow impedances of individual elements may be combined (using, e.g., methods well known in the industry under the term Flow Network Modeling) to compute a single value that corresponds to the airflow impedance of the overall system. Likewise, the characteristic curves of the air-moving devices (which may, for instance, be described largely by attributes such as maximum pressure drop and maximum airflow rate) may be combined into system-level values using methods described later in the disclosure. The intersection of the total system airflow impedance and the system level characteristic curve of all air-moving devices like blower 170 determines the pressure drop throughout the entire system and the airflow rate and pressure drops associated with the elements are determined from the pressure drop of the system and the individual impedances of the elements. Then, accumulating temperatures and temperature gradients can be determined from the ambient temperature at the intake vents of enclosure 110, typically room temperature, and the wattage dissipated and airflow through each of the individual elements.

In some embodiments, a topology monitor of management controller 150 maintains an updated system topology by monitoring changes to elements that affect the topology of the system and airflow and heating patterns. In other embodiments, a service provider, upon making such changes, may enter changes to the topology. The temperatures and/or temperature gradients determined for the system topology may be updated upon notification of a change to the topology to monitor actual temperatures and/or gradients for anomalies.

In several embodiments, a determination of potential failure scenarios may also be updated in response to a change in the system topology. For instance, when a server like a server of servers 120 is removed from system 100 and the system topology is updated, failure scenarios such as airflow loops related to the emptied server slot may be determined. In some of these embodiments, temperatures and/or temperature gradients associated with such airflow loops are calculated and stored in memory so thermal problems related to the airflow loops can be quickly recognized. Further failure scenarios determined for the change in the system topology may include blockage of one or more vents, overheating of one or more processors in the remaining servers, removal of a ventilation cover for maintenance, and other events that can affect airflow and heating patterns in system 100.

When a thermal problem is detected, management controller 150 may analyze the temperature readings from the temperature sensors in enclosure 110 to determine the source, or root cause, of the thermal problem. Temperatures and/or temperature gradients of enclosure 110 are compared with the temperatures and/or temperature gradients of failure scenarios to determine the probable cause of the thermal problem. More specifically, a figure of merit may be determined for each failure scenario by a technique like least squared error using the actual temperatures or gradients sensed and the temperatures and/or gradients estimated for each failure scenario. The failure scenario(s) with the most similar temperatures and/or temperature gradients can then be identified as the probable source(s) of the thermal problem.

Management controller 150 may then report the thermal problem along with the probable source(s) to a service provider. The report may provide the most probable source (s) and may provide a list of potential failure scenarios sorted by the corresponding figure of merit for each. In some embodiments, management controller 150 takes affirmative actions to avoid or attenuate the thermal problem. For example, when the thermal problem involves a processor that is overheating as a result of a lack of airflow, the workload for the processor may be shifted to another processor or server, or in an extreme case, a server or other element may be removed from service.

Power supply module 160 may couple with elements of enclosure 110 to supply power requirements of elements within enclosure 110. In many embodiments, power supply module 160 couples with connectors of enclosure 110 to distribute power to each of the elements like servers 120, management controller 150, blower 170, and switch module 180. In such embodiments, power supplied to each element may be independent or isolated power to avoid the propagation or imposition of noise in power supplied to each of the elements in enclosure 110.

Blower 170 may force air through channels of enclosure 110 to remove heat dissipated by each of the elements and switch module 180 may include switching hardware and software or firmware to couple elements in enclosure 110 with a gigabit Ethernet network, a Fibre Channel network, or the like.

Referring now to FIG. 2, there is shown an embodiment of an apparatus 200 for thermal analysis of a system. Apparatus 200 may include a specific purpose system like a state machines or specific purpose processors, a general purpose machine configured by software to execute aspects of the invention, combinations of the two, or the like in a module of the system or an independent machine remote from the system, coupled via a cable, a network, a wireless network, or the like. Apparatus 200 may couple with temperature sensors 270 of the system, to monitor airflow and heating patterns and other sensors or communications channels to monitor changes to the topology of the system. For example, apparatus 200 may be adapted to determine the root cause(s) of a thermal problem when that determination is most useful, at the time of the thermal problem so that it can influence the remedy applied to the system, and, in some embodiments, apparatus 200 may also serve as a post-mortem diagnostics tool. In particular, when a log file exists and the log file includes information on the system topology and temperature readings, apparatus 200 can be adapted to analyze the system after-the-fact.

Apparatus 200 includes a topology updater 210, a temperature monitor 220, a failure determiner 230, an operation adjuster 248, and memory 250. Topology updater 210 may couple with the failure determiner 230 to modify data describing a topology of the system in response to a change made to an element such as the installation of a server to or removal of a server from the system. For example, an alarm of the system may indicate that a server is removed, and topology updater 210 may respond by entering the change to the topology of the system in memory 250. Then, topology updater 210 may instruct failure determiner 230 to determine or select failure scenarios associated with the removal of the server. Failure determiner 230 may receive the instruction and determine or select failure scenarios associated with different airflow characteristics near the server such as additional air intake resulting in modified pressure drops throughout ventilation of the system. In some embodiments, topology updater 210 may also couple with temperature monitor 220 to update expected temperatures throughout the system based upon changes to elements such as the removal or installation of a server.

Temperature monitor 220 may couple with the temperature sensors 270 of the system to receive the temperatures and to detect a difference between the temperatures received and expected temperatures. In particular, temperature sensors 270 detect temperatures dependent upon airflow and heating patterns of elements within an enclosure of a system and temperature monitor 220 may compare the actual temperatures within the enclosure against expected temperatures 254. Temperature monitor 220 includes an expected temperature determiner 222, a gradient identifier 224, and a threshold comparator 226.

Expected temperature determiner 222 may calculate the expected temperatures 254 throughout the system based upon proper operation of the elements. For instance, when a server is added to the system, topology updater 210 may indicate the addition of the server. The new server may add a new channel of ventilation in parallel with other servers that increases the heat dissipated in the enclosure and the temperature of the air exhausted from the enclosure. The heat added is added by the power dissipation of the processors, memory, hard drives, and other components of the server and is estimated by expected temperature determiner 222 based upon the specifications for the server and expected airflow and heating patterns of other servers. In several embodiments, specifications for different server types may be included in memory 250.

Gradient identifier 224 may identify an upward temperature gradient for a temperature of the temperatures received from temperature sensors 270. For instance, a change to the topology of the system may change airflow and heating patterns of the system, causing a thermal problem and gradient determiner 224 may facilitate early detection of the thermal problem by comparing actual temperature gradients with expected temperature gradients. Further, when the change in the system is anticipated such as the removal of a side panel, but the change in the airflow or heating pattern differs from expected airflow or heating patterns, such as heat dissipation from an increased rate of failure of a component instigated by changing the airflow and heating patterns of the system, comparing the actual temperature gradient with the expected temperature gradient can avoid or attenuate damage to other components by detecting the thermal problem early.

Threshold comparator 226 may identify a temperature of the temperatures received that exceeds a threshold temperature in addition to or as an alternative for comparing temperature gradients. In particular, the threshold temperatures of elements within the enclosure of the system according to manufacturer specifications along with one or more intermediate alarm temperature thresholds may be stored in threshold temperatures 251 and threshold comparator 226 can work in conjunction with gradient identifier 224 to determine when a thermal problem or a threat of a thermal crisis is present. For example, a server may be installed in the system that exceeds or contradicts the specifications for the system and even though the temperatures may rise as expected, alarm levels described in temperature thresholds 251 may be reached for some elements, instigating a determination of the probable source of the thermal problem. More specifically, the added server may, e.g., have inadequate ventilation for the system or dissipate more heat than the system was designed to facilitate. In such as situation, although temperatures rise as expected, the temperature(s) in part of the system may reach or exceed alarm temperature thresholds for an element, or a component thereof. Thus, temperature comparator 226 recognizes the alarm temperature threshold has been reached and instructs failure determiner 230 to determine the probable source of the thermal problem. In many embodiments, temperature comparator 226 may also initiate an alarm for the exceeded temperature threshold.

On the other hand, threshold comparator 226 may operate for some or all elements as an alternative to comparing temperature gradients. For instance, some critical components of an element like a processor may be damaged by slight increases in temperature so an alarm temperature threshold may be set for slight increases in the ambient temperature near the processor, instigating an alarm, a determination of the probable source of the temperature to rise, and a shift in the workload of that processor until the probable source is resolved.

Failure determiner 230 may couple with temperature monitor 220 to determine potential airflow and heating patterns for an element of the system that is substantially consistent with the temperatures received from temperature sensors 270. In some embodiments, failure determiner 230 may compare instantaneous or steady state temperatures of the system with temperatures associated with failure scenarios 260 to determine the probable source of a thermal problem. In a further embodiment, failure determiner 230 may compare changes in temperatures over a period of time against temperature gradients of failure scenarios 260 to determine the probable source of a thermal problem.

Failure determiner 230 may include a scenario selector 232, a scenario calculator 234, a scenario comparator 238, a scenario sorter 240, and a source identifier 242. Scenario selector 232 may couple with memory 250 to select a failure scenario associated with temperatures, based upon the temperatures received from temperature sensors 270 and a topology of the system that is substantially contemporaneous with the temperatures received (the most recent update from topology updater 210). In some embodiments, scenario selector 232 may compare actual temperatures or temperature gradients with temperatures and gradients associated with failure scenarios in scenario temperatures 262 and scenario gradients 264, respectfully, to select failure scenarios that are comparable to the actual temperatures received from temperature sensors 270. For example, failure scenarios 260 may include potential failure scenarios for various root causes of thermal problems and include formulas having installation specific variables like the ambient room temperature in which the system resides, element heat dissipations, and blower characteristic curves. Then, scenario selector 232 uses the actual temperatures and gradients for the system to select the failure scenario(s) that have similar patterns of temperatures and/or temperature gradients. In such embodiments, the temperatures and gradients for failure scenarios determined for each potential root cause of thermal problem for the system may be available.

On the other hand, in situations wherein calculations for temperatures or temperature gradients have not been determined prior to initiation of failure determiner 230 like situations in which the thermal problem begins to develop while the system topology is being modified and temperatures and/or gradients for potential elements have not been previously calculated, scenario selector 232 may select potential failure scenarios based upon a change in the topology of the system and initiate scenario calculator 234 to determine scenario temperatures 262 and scenario gradients 264. In particular, scenario selector 232 may select and combine potential events, or root causes, that could cause a thermal problem or a pattern of temperatures and/or temperature gradients and initiate scenario calculator 234 to estimate the temperatures and/or temperature gradients associated with each scenario to facilitate determining the probable source of the thermal problem.

In further embodiments, scenario selector 232 produces or generates a large number of failure scenarios and rejects those scenarios that cannot exist because an element is or is not installed. For example, a server in the third server slot cannot overheat if no server is installed in the third server slot. Once an element or possible failure mode for an element has been identified, scenario calculator 234 may adjust parameters, e.g., airflow rates, wattage dissipations, etc., and computes the predicted temperature profile for the scenario. Additional scenarios may then be identified and evaluated in a similar manner.

In many embodiments, scenario selector 232 may also develop failure scenarios to account for partial obstructions and partial overheating. In particular, some failure scenarios, such as vent obstructions and component overheating are not binary, i.e., they may occur to varying degrees of intensity and scenario selector 232 may develop failure scenarios that use incremental steps to cover these varying degrees of overheating/obstruction. For example, an obstruction failure scenario may include a high value of impedance in one location, corresponding to a total obstruction at that location. But alternate failure scenarios may also be developed based upon lower values of impedance at this same location corresponding to 25% obstructed, 50% obstructed, 75% obstructed, etc. Use of incremental steps for obstructions and overheating may facilitate a more accurate identification of the source of a thermal problem.

Scenario calculator 234 may couple with the scenario selector 232 to calculate the potential airflow and heating patterns for failure scenarios. Scenario calculator 234 may access expected airflow and heating patterns 252 of memory 250 to determine the elements through which air may flow, including, e.g., grill-work, plenums, air channels, spaces between circuit boards and other elements like air moving devices such as fans, blowers, etc. and, to the extent that airflow impedances have not been calculated, scenario calculator 234 may determine the impedance to airflow for each element based upon a number of formulas to estimate airflow impedance or based upon data measured data for real or modeled elements. The formulas may take into account physical dimensions, grill-work and slots, turns, smoothness of surfaces, etc. and the impedance to airflow is typically stored via values having units of 'in $H_2O/CFM^2$' or its metric equivalent. For air moving devices such as fans and blowers, scenario calculator 234 may also identify the maximum airflow (CFMmax) that the device can produce and the maximum static pressure (Pmax) when airflow is zero, which can typically be obtained from the manufacturer's specification sheet and stored in memory 250. Then, for each element that produces heat, scenario calculator 234 may identify the maximum wattage dissipated by the element. FIG. 3A illustrates an example system including relationships of various elements.

The airflow and impedance of each of the elements of the system like the system shown in FIG. 3A may be stored in a data structure to facilitate a determination of the airflow and heating patterns for the system such as the tree structure shown in FIG. 3B. Leaf nodes in the tree like R1, P1, S1, R2, R4, etc., represent the physical elements that move or impede airflow. Parent nodes like S1, P1 S2, and P2 of various types relate leaf nodes as combined in parallel (P) or serial (S) fashion.

To build the tree, scenario calculator 234 detects serial and parallel configurations of elements. Serial configurations are detected by looking for nodes in the topology that are shared by two elements. Parallel configurations are detected by looking for elements that share nodes at both ends. Loops are handled by loop calculator 236.

Upon building a tree structure, the impedance of the entire system (Rsys) is determined. In particular, at serial nodes, the impedance of all child nodes are summed by equation 1:

$$R = R1 + R2 + R3 + \ldots \quad \text{Equation 1}$$

For instance, the impedances of R2 and R4 are serially connected according to the tree structure in FIG. 3B and are summed. At parallel nodes, the impedance of child nodes combine according to equation 2:

$$\frac{1}{\sqrt{R}} = \frac{1}{\sqrt{R1}} + \frac{1}{\sqrt{R2}} + \frac{1}{\sqrt{R3}} + \ldots \quad \text{Equation 2}$$

For instance, the sum of R2 and R4 is combined with R3 in accordance with equation 2. Equation 2 is not the more familiar formula for parallel resistors used in electronic circuits because unlike the linear relationship between voltage, current, and electrical resistance, airflow impedance is related to static pressure and airflow volume via the quadratic formula shown in Equation 5. Equation 5 may assume completely turbulent flow, which is a reasonable assumption for high flow rates in a complicated chassis with electronic components in the pathways. Under some circumstances it may be appropriate to modify the relationship for more laminar airflow.

The values for underlying nodes of an S (serial) node or a P (parallel) node in the tree such as R1, P1, R5, and P2 can then be combined to determine the R value for the parent or root node S2. The R-value of the root node is Rsys.

In addition to determining the impedances for each node of the tree, the maximum airflow (CFMsysmax) and maximum pressure (Psysmax) may be determined from all air moving devices like F1. More specifically, at serial nodes, the underlying Pmax values are added and lowest value of CFMmax is selected. At the parallel nodes, the underlying CFMmax values are added and the lowest Pmax value is selected. Note that these are approximations that are valid if serial or parallel configurations of air moving devices use matching fans or blowers and that although FIG. 3A shows only one air moving device, configurations involving multiple air moving devices in both serial and parallel configurations are common. In some cases, scenario calculator 234 may adjust the model to more closely match hardware behavior. For example, it has been empirically determined that for serial fans the pressure drop obtained is usually closer to 60% of the sum. Like the impedance values, these computations propagate up through the tree structure and the values computed for the root node become CFMmaxsys and Pmaxsys.

Upon determining CFMmaxsys, Pmaxsys, and Rsys, the operating point of the system (CFMsys) may be determined by finding the intersection between the characteristic curve of the air moving devices and the enclosure resistance curve. In particular, the characteristic curves of air moving devices are approximated as straight lines defined by CFMmaxsys and Pmaxsys with equation 4 (determined from equation 3):

$$CFM = \frac{-CFM_{max\ sys}}{P_{max\ sys}} \times P + CFM_{max\ sys} \qquad \text{Equation 3}$$

$$P = P_{max\ sys} \times \left(\frac{CFM - CFM_{max\ sys}}{-CFM_{max\ sys}}\right) \qquad \text{Equation 4}$$

Note in Equation 3 that when P=Pmaxsys then CFM=0 and when P=0 then CFM=CFMmaxsys.

The enclosure resistance curve may be determined via equation 5:

$$P = R_{sys} \times CFM^2 \qquad \text{Equation 5}$$

The overall system operates at the point where the static pressure drop created by the air moving devices and the static pressure drop through the enclosure is the same. Setting Equation 4 equal to Equation 5 and solving for CFM (which is CFMsys) gives equation 6, resulting in a CFMsys equal to 100.34 for the example system topology described in FIGS. 3A and 3B:

$$CFM_{sys} = \frac{\frac{-P_{max\ sys}}{CFM_{max\ sys}} + \sqrt{\left(\frac{P_{max\ sys}}{CFM_{max\ sys}}\right)^2 + 4 R_{sys} P_{max\ sys}}}{2 R_{sys}} \qquad \text{Equation 6}$$

CFMsys is the total airflow through the enclosure and is associated with the root node S2. The total airflow through the enclosure can then be split up among child nodes to determine the airflow through each portion of the enclosure. More specifically, with regards to S nodes, since the series nodes have the same airflow, the CFM value of the parent S node becomes the CFM value for all child nodes. At P nodes, the airflow is divided amongst all child nodes with each child node getting a portion of the airflow proportional to the child node's airflow impedance. The portion that a given child node will be allocated is given by equation 7:

$$CFM_{CHILD} = CFM_{PARENT} \times \sqrt{\frac{R_{PARENT}}{R_{CHILD}}} \qquad \text{Equation 7}$$

Once the airflow in CFM is known for any element, the temperature rise (in ° C.) within that element can be determined with equation 8:

$$\Delta T = \frac{1.76 \times W}{CFM} \qquad \text{Equation 8}$$

Note that 1.76 is a workload factor that is a selected value for temperature determinations and W is the wattage, or power, dissipation from an element, but other values may be used. For example, a more conservative value for the workload factor is 1.85.

Scenario calculator 234 may then determine the temperature of the elements based upon the incoming air temperature from all elements prior to it in the airflow pattern and each element's own contribution to temperature rise. Each node may be given an 'input temperature' and the output temperature may be determined based upon the type of node. In particular, the root node may be given an 'input temperature' that it is the ambient temperature of the room in which the system resides or the intake temperature of the enclosure at the system's intake vents and the 'output temperature' is the exhaust temperature from the rear of the enclosure of the (assuming front to back airflow). At leaf nodes, the output temperature is simply the input temperature plus the temperature rise within that element. At S nodes, the input temperature to the S node is passed to the first child node and the value of output temperature determined by scenario calculator 234 is used as the input temperature for the next child node in the series. Scenario calculator 234 repeats these determinations until all child nodes have contributed to the temperature rise. The output temperature reported by the last child node is the output temperature of the parent of the S node.

At P nodes, scenario calculator 234 passes the input temperature of the P node to each child node as an input temperature. The output temperature of the P node is calculated as the weighted average of all child node output temperatures based upon the airflow associated with the corresponding child node. The airflow (in CFM) of each child node, for example, may be used as the weighting factor. Note that this assumes total mixing of air. FIG. 3D shows the results of these calculations for the example system shown in FIGS. 3A and 3B.

In some embodiments, the values of R (airflow impedance) and W (wattage dissipated) and the values of Pmax (maximum static pressure) and CFMmax (maximum airflow) for the elements may be available, for example, from a data file or database in memory 250 that allows identification numbers of enclosures and elements to be looked up and the R, W, P, and CFM values provided from the data file or database. In other embodiments, the R, W, P, and CFM values may be 'built in' to the enclosures and elements by making them available as entries in erasable-programmable read only memories (EPROMs).

In several embodiments, when the bay for, e.g., a switch module is not occupied, scenario calculator 234 looks up values in memory 250 to substitute for the filler plate that occupies that bay. Memory 250 may also include a description of which values to use when an element is removed and the filler plate is left out, thus creating a new airflow pattern. For example, for an enclosure bay that accepts an Ethernet Switch module, memory 250 may include the normal airflow entrance and exit along with the entrance/exit created by the side of the module. The impedance paths associated with the side panel of an Ethernet switch module would have very high values, since air does not flow along that path. However, the impedance values for a missing filler plate and switch module would have very low values for these paths, since the open side of the bay presents a very tempting path for air to enter or exit the enclosure. The topology of the system, as described in memory 250, may show that these paths are possible and allow the element that is selected to occupy this bay (including an empty bay and/or missing filler plate or partially connected filler plate) to provide the correct impedance values.

In many embodiments, when determining failure scenarios, a new model (tree structure) is determined that corresponds to the current system topology plus the change introduced by the failure scenario. Failure scenarios may include, e.g., the removal of one or more filler pates, the partial or total blockage of one or more intake vents, the overheating of one or more elements, partial or total fan failures, etc., and combinations thereof. Some failure scenarios may alter the values of parameters such as an impedance (R-value) or wattage dissipated (W-value), while others failure scenarios may change the topology (such as the removal or partial removal of an element). Further failure scenarios may be rejected outright, e.g., a scenario for IBM BladeCenter that requires the overheating of processor blade #6 may be rejected if it is known that processor blade #6 is not installed or not powered.

In several embodiments, each element may dissipate a variable amount of heat, depending upon the level of system activity. For example, in the IBM BladeCenter an individual processor blade may dissipate hundreds of watts when the corresponding server is extremely busy and far less wattage when it is idle. These variable wattages can have a direct effect upon the computed and observed temperatures and scenario calculator 234 may incorporate various methods of dealing with the variable wattages.

In some of these embodiments, scenario calculator 234 may use the temperature associated with maximum power dissipation in all calculations. In theory, thermal problems will cause temperatures high enough above nominal value to be distinct. Also, the lower temperature readings will be introduced into the figure of merit for all scenarios equally, except for scenarios that result in some temperatures falling due to increased airflow around an obstruction. In the worst case, scenario calculator 234 will be less sensitive to temperature changes, recognizing large temperature shifts.

In other such embodiments, scenario calculator 234 may determine that the base readings are lower than expected airflow and heating patterns 252 for that configuration and adjust wattage dissipation for each element downward accordingly, until expected airflow and heating patterns 252 match well. Then, failure scenarios would be created from this alternate base case. Note that this approach can incorporate periodic readjustment of a 'loading factor' for elements throughout the day and tracking of the loading factors up to the point where a problem is detected, at which time scenarios are built using the last known loading factors. Note that the loading factors are not the same as the "workload factor" described in conjunction with equation 8.

In several embodiments, wherein the system topology rarely changes, scenario calculator 234 may compute the expected temperature readings for a large number of failure scenarios in advance and keep them available in scenario temperatures 262 of failure scenarios 260 until needed. Then, when a thermal problem is detected, the figure of merit for each possible scenario can be quickly computed without having to do many computations at the time of the problem. Further, when topology updater 210 detects a change to the system topology, the old set of expected readings can be discarded and/or a new set can be computed. In an alternative embodiment, a set of temperature readings for all possible topologies and all possible thermal problems are calculated during the product's development phase and stored in a data file or database in memory 250. Then, at the time of a thermal problem, the scenario selector 232 looks up the set of temperature readings that correspond to the current system topology and computes the figure of merit for each failure scenario.

Figure 4B:
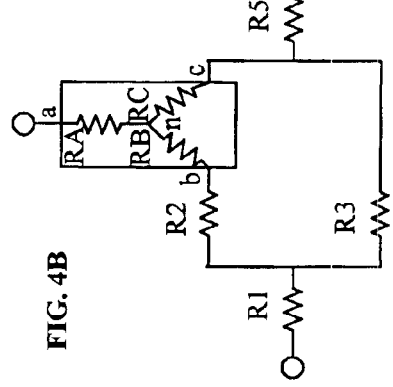
FIGS. 4A–F depict an embodiment of a model and a data structure for thermal analysis of a system having an airflow loop for FIG. 2.
Figure 4A:
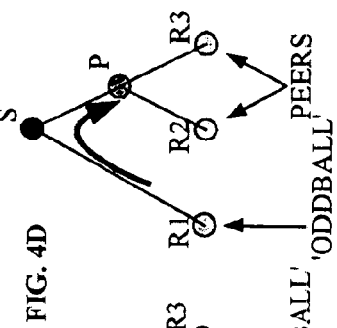

Loop calculator 236 may calculate the potential airflow and heating patterns based upon an airflow loop via an opening associated with the element. In particular, loops are detected when identifying serial and parallel elements (and a single node in the tree is designed to represent the combined serial or parallel elements) and after all serial and parallel elements have been described, the root node cannot be described as a single S or P node. Loop calculator 236 then looks for configurations of three elements that combine end to end to form a loop (i.e., return to the starting point). For example, if one of the failure scenarios for the network shown in FIG. 3A is the removal (without replacement) of the element represented by R4, then alternate airflow paths exist. More specifically, it is possible that air could continue to flow along the original R4 path (i.e., from the original intake of this element to its original exhaust point). It is also possible that air might be sucked in through the open wall and exit through the element's exhaust point. It is even possible that air might enter or exit the system through a hole in the enclosure via the original intake for this element. And, it is possible that some combination of these possibilities might actually be manifested. These three new possible paths are shown in FIG. 4A as R4a, R4b, and R4c.

Analogous to the situation in electrical engineering, the delta circuit may be replaced by a 'star' circuit having the same characteristics to the outside world, i.e., resistance measurements taken between the three connection points would be the same for both the delta and star configurations). FIG. 4B shows the delta circuit temporarily replaced by a star circuit. Once the delta is replaced with a comparable star, the rest of the circuitry reduces to parallel and series circuits. The star network impedances are referred to as the Thevinen equivalents of the original loop network. The values for the star components can be determined by from equations 9, 10, and 11:

$$R_a = \frac{R_{4b} \times R_{4c}}{(R_{4c} + R_{4a} + R_{4b})} \qquad \text{Equation 9}$$

$$R_b = \frac{R_{4c} \times R_{4a}}{(R_{4c} + R_{4a} + R_{4b})} \qquad \text{Equation 10}$$

$$R_c = \frac{R_{4a} \times R_{4b}}{(R_{4c} + R_{4a} + R_{4b})} \qquad \text{Equation 11}$$

Figure 4D:
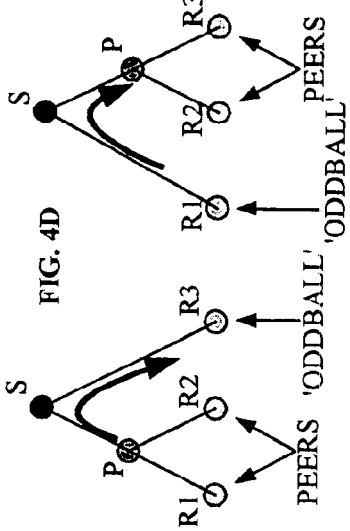
Figure 4C:
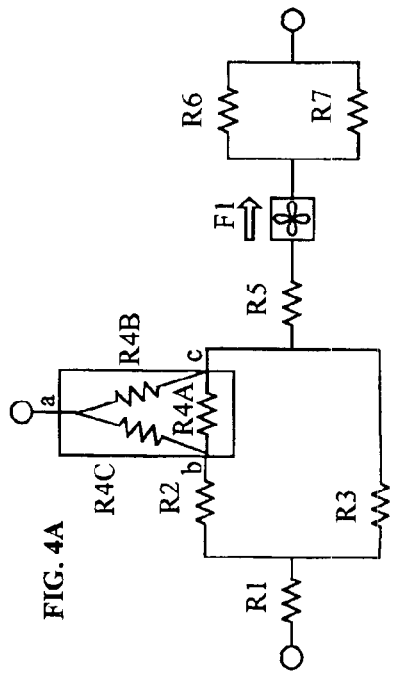

After determining the equivalent star impedances (Ra, Rb, and Rc in FIG. 4B) the tree data structure is constructed using the star elements in series and in parallel with other existing elements as shown in FIG. 4C. In FIG. 4C, substituted star elements are inserted in the tree as special D (for delta) nodes and an 'underlying' layer of three real nodes are connected to retain a link to the real physical elements. Note that after R4a, R4b, and R4c in FIG. 4B have been replaced by an equivalent star network, Ra, Rb, and Rc, and newly created S nodes and P nodes have been detected and entered into the tree, additional delta loops may still exist. In this case, after R2 and Rb in FIG. 4B are combined into a serial node R2b, an additional delta loop exists consisting of elements R3, Rc, and R2b. Therefore, the handling of delta loops in the model may be repetitive, just as the detection and handling of S nodes and P nodes is repetitive. In FIG. 4C, it is possible that additional tree structure could exist under the nodes marked R2, R3, and R4 if they were not individual elements but instead were composed of serial, parallel, or loop configurations.

Rsys is then determined by combining child impedances and propagating the calculation up through the tree—the Thevinen equivalent impedances (Ra, Rb, and Rc in FIG. 4C) of the underlying loop impedances (R2, R3, and R4). Scenario calculator 234 may then proceed with calculations as previously described.

Then, loop calculator 236 may determine CFMmaxsys and Pmaxsys by combining CFMmax and Pmax of child nodes and propagating the calculation up through the tree. In many embodiments, air-moving devices like blowers may be restricted to being located outside of an airflow loop.

Once the system airflow CFMsys is known, CFMsys is divided amongst all system elements. More specifically, loop calculator 236 first determines which of the three legs of the star network are inputs (i.e., air flowing towards the center of the star) and which are outputs. Loop calculator 236 may determine this by analyzing the placement of the star within the tree structure. Two D nodes will have a P node as a common ancestor (i.e., higher in the tree) and all three will have an S node as a common ancestor. The D nodes that are under the common P nodes are referred to as peers and the remaining D node are referred to as the 'oddball' as shown in FIG. 4D. Then, loop calculator 236 takes into account the ordering (under the common S node) of the path between the common P node and the oddball node to determine the direction of airflow. When a depth-first traversal of the tree encounters the common P node before the oddball node, then the peer nodes are both treated as inputs and the oddball node is treated as the output. When a depth-first traversal of the tree encounters the oddball node before the common P node, then the oddball node is treated as the input and the peer nodes are treated as outputs.

Figure 4E:
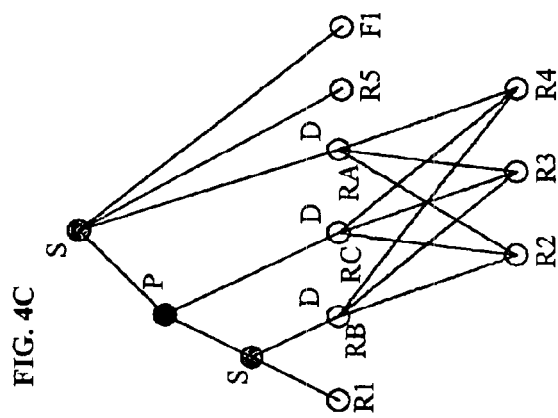

As an apportionment of airflow is allocated down through the tree and reaches D nodes, the D nodes store the value until all three D nodes in the same star have an allocation of airflow. When all three D nodes in a star have an airflow allocation and an assigned direction (in or out), loop calculator 236 can determine the airflow of the original loop nodes using the pressure differences associated with the star network. Potential relationships between the star network and the delta loop are illustrated in FIG. 4E. In particular, loop calculator 236 may convert the airflow and impedance of each of the three star elements, Ra, Rb, and Rc, into an equivalent static pressure using Equation 5. Then, for each of the three sets of nodes surrounding the star (i.e., a, b, and c in FIG. 4B), loop calculator 236 may determine the static pressure drop between the nodes by the difference between the pressure drops associated with the star elements and the polarity of the drop will be determined by the larger of the two pressure drops if the star element connected to one node has the same directional assignment assigned as the star element connected to the other node. Otherwise, the sum of the pressure drops associated with the star elements and the polarity of the drop will match both of them if the star element connected to one node has the opposite directional trait when compared to the star element connected to the other node.

Once the static pressure drop between two nodes of the loop are known, the airflow through the original loop element can be determined by applying a variation of Equation 5 to the element using the computed static pressure drop and the impedance of that element. Loop calculator 236 repeats this until the airflows through all three of the original loop elements are known.

After the airflow through an original loop element is known (e.g., the airflow through R2, R3, and R4 in FIG. 4C), then the airflow through underlying S, P, or D nodes in the tree can be determined. (This corresponds to the airflow in serial, parallel, or loop-forming elements that combined to make up a portion of a larger loop.)

Loop calculator 236 may then determine the temperature rise within each element by combining the airflow and power dissipation of each element via Equation 8 to compute a temperature rise across the element. Loop calculator 236 computes temperatures throughout the enclosure by taking into account input temperature and temperature rise at each element. When computing the actual temperature at the exit of each element like a server, the D nodes that appear in the tree do not represent real components but the Thevinen equivalents in the form of a substituted star network. Loop calculator 236 may compute the output temperature of a D node for a given input temperature and propagate the calculation down to the original D loop elements. First, loop calculator 236 determines the actual direction of the airflow through the original D elements. (The directional trait determined for the star elements is not directly applicable to the loop elements.) In particular, when called upon to determine the output temperature of a D node (which is the Thevinen equivalent star element), loop calculator 236 examines the previously determined directional trait of the associated star elements element and the airflow values computed for the two loop elements that connect to the node; recognizes that the airflow into the star element either splits into the two loop element airflows, combines with one of them to deliver air to the other, or receives air from both of them; and that, in any case, the three airflow values sum to zero (The air flowing into this portion of the network matches the air flowing out of this portion of the network).

Figure 4F:
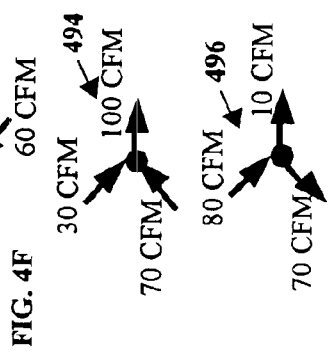

Looking at FIG. 4F, when the star element associated with this D node is an input to the star and the airflow values computed for the two adjacent loop elements are both smaller than the input to this D node as shown at 490, air flows out through each loop element. Thus, for each of the output paths, loop calculator 236 computes the temperature of other nodes by uplifting the input temperature by the temperature rise of the associated loop element and non-zero values are discarded.

When the star element associated with this D node is an input to the star and at least one of the airflow values computed for the two adjacent loop elements is larger than the input to this D node as shown at 492, the largest adjacent value corresponds to the output and the other value combines as an input with the input to this D node. Loop calculator 236 combines the input temperatures proportional to the input air flow volumes and uplifts the combined temperatures by the temperature rise of the loop element associated with the output leg, computing the input temperature of a peer node of the loop and discarding any non-zero value for output temperature of the D node.

On the other hand, when the star element associated with this D node is an output from the star and the airflow values computed for the two adjacent loop elements are both smaller than the output from this D node as shown at 494, air flows out through each loop element. The output temperature of the node will be the temperature of both inputs uplifted by the temperature rise of their associated loop element and mixed proportionally to the airflow volume. The returned temperature value is passed to other nodes.

When the star element associated with this D node is an output from the star and at least one of the airflow values computed for the two adjacent loop elements is larger than the output from this D node as shown at 496, the largest value corresponds to the input and the other loop element and this D node are both outputs. The output temperature of this node will be the temperature of the input uplifted by the temperature rise of its associated loop element. The returned temperature value is passed to other nodes.

In some embodiments, when computing the temperature rise of a P node that is associated with a D node, loop calculator 236 may defer the calculation until a peer D node is computed. For example, when a D node is found, it may not be possible for a first D node to provide this information until a peer D node has also completed some calculations, hence a deferral is implemented. In one embodiment, loop calculator 236 sets an output temperature value of 0.0 to indicate a deferral request and loop calculator 236 completes the calculation for the deferring D node last. When the output temperature of the peer D node is computed, the deferred D node is evaluated and the calculation of the P node output temperature is finalized.

Scenario comparator 238 may couple with the scenario calculator 234 to compare temperatures associated with the potential airflow and heating patterns against the temperatures received from temperature sensors 270. More specifically, for each valid failure scenario, scenario comparator 238 may compare temperatures determined for the failure scenario with expected temperatures 254 and compute a figure of merit, which is an indication of how well the base model of a failure scenario matches the observed temperature readings. In some embodiments, the temperatures and/or temperature gradients may be compared via a method like least squared errors.

In several embodiments, scenario comparator 238 may comprise a trend determiner 239. Trend determiner 239 may determine a trend associated with the temperatures received from temperature sensors 270 to compare temperatures associated with the trend against temperatures associated with a failure scenario. For instance, two or more sets of temperature readings from temperature sensors 270 may indicate the temperature gradients in different parts of the enclosure of the system and those temperature gradients may be compared with temperature gradients associated with a failure scenario to determine a figure of merit indicating the similarity between the failure scenario and the actual, or observed, temperature readings.

Scenario sorter 240 may couple with scenario comparator 238 to sort the failure scenario and other failure scenarios based upon a degree of similarity between the temperatures associated with the potential airflow and heating patterns of the failure scenario and the temperatures received. For instance, scenario sorter 240 may sort the failure scenarios based upon a figure of merit determined for each scenario. In some embodiments, the failure scenario(s) having the lowest figure of merit may represent the failure scenario(s) most similar to the thermal problem as evidenced by the temperatures and/or temperature gradients determined from temperature sensors 270.

Source identifier 242 may identify an element as a source of the difference in temperatures and/or temperature gradients and report the element to a maintenance provider. In particular, source identifier 242 may select the figure(s) of merit that indicate the closest match to the observed temperature readings. The selection of any figure of merit points to a corresponding failure scenario that is the likely root cause of the thermal problem observed. Note that more than one failure scenario may result in the same figure of merit, indicating a small number of equally likely root causes for the thermal problem.

Operation adjuster 248 may couple with failure determiner 230 to adjust an operation of the system to modify a temperature gradient of the system in response to determining the potential airflow and heating patterns for the element. For example, once a thermal problem is associated with a failure scenario, that failure scenario may indicate that, e.g., a vent is partially blocked so operation adjuster 248 may modify heat dissipation in the area of the partially blocked vent based upon the extent of the partial blockage by reducing operations performed by the elements near or coupled with airflow associated with the partially blocked vent.

Memory 250 may couple with failure determiner 230 to store the expected temperatures and airflow and heating patterns, wherein the expected airflow and heating patterns are associated with a topology of the system. Memory 250 includes data storage for threshold temperatures 251, expected airflow and heating patterns 252, and failure scenarios 260. In several embodiments, memory 250 includes random access memory (RAM) like the main RAM of a computer system and/or flash. In other embodiments, memory 250 may include read only memory (ROM) or compact disk (CD) ROM for expected airflow and heating patterns associated with the enclosure of the system, and volatile memory for threshold temperatures of elements of the system, expected airflow and heating patterns associated with the topology of the system based upon the current configuration of elements, and failure scenarios 260. In other embodiments, memory 250 may include data storage devices like optical drives, hard drives, and the like.

Figure 5:
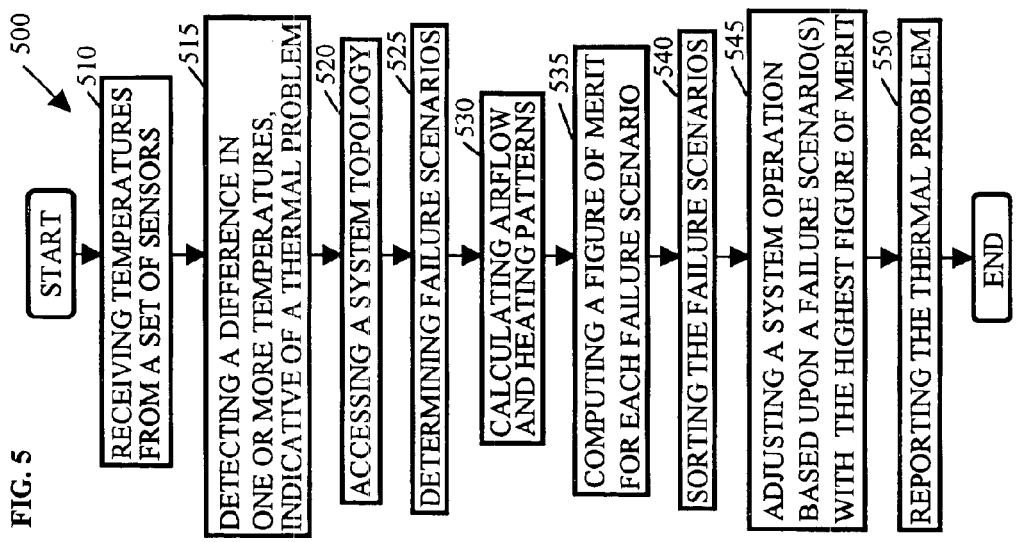
FIG. 5 depicts an example flow chart of a method for thermal analysis of a system when the airflow and heating patterns associated with failure scenarios are determined after a thermal problem is detected.

FIG. 5 depicts an example flow chart 500 of a method for thermal analysis when the airflow and heating patterns associated with failure scenarios are determined after a thermal problem is detected. Flow chart 500 begins with element 510, receiving temperatures from a set of sensors. The sensors may be temperature sensors and/or temperature gradient sensors and element 510 may involve receiving, e.g., a voltage proportional to the temperature at each sensor within an enclosure of the system.

In element 515, the difference between the temperatures of the set of sensors may indicate a thermal problem. For instance, temperatures within the enclosure may begin to rise with no detected change to the system topology or the temperatures may begin to rise after a change is made to the enclosure but in a pattern or at a rate that is either unexpected or may potentially cause an element, such as a server or a component of an element like a processor within a server, to reach a threshold temperature. The threshold temperatures can be set as alarms for various elements or components in the enclosure, indicating that the temperature is approaching or within a specified range of a damage threshold temperature. In some embodiments, the expected temperatures resulting from certain changes to the system topology, like the removal of a panel for maintenance, may be stored in memory so that the temperatures resulting from the removal of the panel can be compared with the temperature readings from the sensors and when the temperatures do not coincide with the expected temperatures, a thermal problem may exist.

Element 520, accesses the system topology for determining failure scenarios that may be related to the detected thermal problem and element 525 may determine failure scenarios to facilitate identification of the thermal problem. Some failure scenarios may be ruled out because the state of the system does not support the possibility. For example, a failure scenario may include the overheating of a processor in a server but the processor and/or the server may not be installed or powered. Failure scenarios may also include, for instance, overheating of an element or a component of an element; partial or total failure of an air mover like a cooling fan; failure of heating, ventilation, and air conditioning (HVAC) equipment in the room wherein the system resides, increasing the ambient temperature of the room; inadequate HVAC equipment for the heat generated in the room; obstruction of a vent of the system inside or outside the enclosure; removal or replacement of an element of the system like a panel or server of the system; over configuration of the system; and etc., and combinations thereof.

Some failure scenarios may account for variations of a root causes of thermal problems, such as variations in the extent to which a vent is blocked, to increase the accuracy of determination of the root cause(s) of the thermal problem. For instance, failure scenarios may account for blockages of a vent from 10 percent blockage to 100 percent blockage in steps of 10 percent.

Element 530 calculates the airflow and heating patterns associated with each of the possible failure scenarios by modifying the airflow and heating patterns associated with the system topology. The airflow and heating patterns may be determined based upon calculations described in the discussion for FIGS. 2, 3, and 4, or the like. For example, the amount of heat dissipated by a component like a processor may be varied by, e.g. 15 percent, and the airflow and heating patterns for the system topology may be recalculated based upon the change in the heat dissipated by the processor. Then, temperatures associated with various parts of the enclosure corresponding to the placement of the temperature sensors, according to failure scenarios may be recalculated to facilitate a comparison of the scenario temperatures and the temperature readings from the sensors. Other embodiments determine scenario temperature gradients in additional to or as an alternative to determining the scenario temperatures for comparison against temperature gradients of the actual temperature readings from the enclosure.

After determining the airflow and heating patterns associated with the enclosure of the system, element 535 computes a figure of merit for each failure scenario to determine the degree of similarity or discontinuity between the temperatures resulting from the root cause(s) described by the failure scenarios and the thermal problem. The figure of merit may be based upon the differences between the temperatures and/or temperature gradients resulting from the root cause(s) of the failure scenarios and the thermal problem.

Element 540 sorts the failure scenarios or root cause(s) associated with the failure scenarios based upon the figure of merit corresponding to each and element 545 adjusts an operation of the system automatically upon identifying a failure scenario having a high degree of similarity or a low degree of discontinuity like the failure scenario at the top of the sorted list of failure scenarios. In some embodiments, adjustment of an operation of the system may be made when the degree of similarity is above a specified degree or the degree of discontinuity is below a specified degree of discontinuity. In several embodiments, the failure scenarios may be prioritized based upon severity of the corresponding root cause(s) or maintenance involved with resolving the root cause(s). In other embodiments, adjustments to the system's operation are made based upon the root cause of the most likely failure scenario when a root cause of another potential failure scenario is not amplified by the adjustment. For example, when the most likely failure scenario includes a partially blocked panel and adjustment to the system to compensate for the partially blocked panel includes shifting workload from one processor to another, the processor to which the workload is shifted may be selected avoid exacerbating the root cause of the second most likely failure scenario like an overheated processor in the same element.

Element 550 reports the failure scenario(s) having the highest degree of similarity or lowest degree of discontinuity, such as the highest figure of merit, to a service provider. In other embodiments, a list of potential root cause(s) and/or failure scenarios are reported to the service provider in an order based upon the degree of similarity or discontinuity, allowing the service provider to prioritize the servicing of the system and determine an approach for resolving the root cause(s) of the thermal problem. The failure scenario(s) may be reported to the service provider by one or more available means such a system message displayed locally and or remotely via a network, by lights and/or alarms of the enclosure, phone message, fax, printout, etc.

Figure 6:
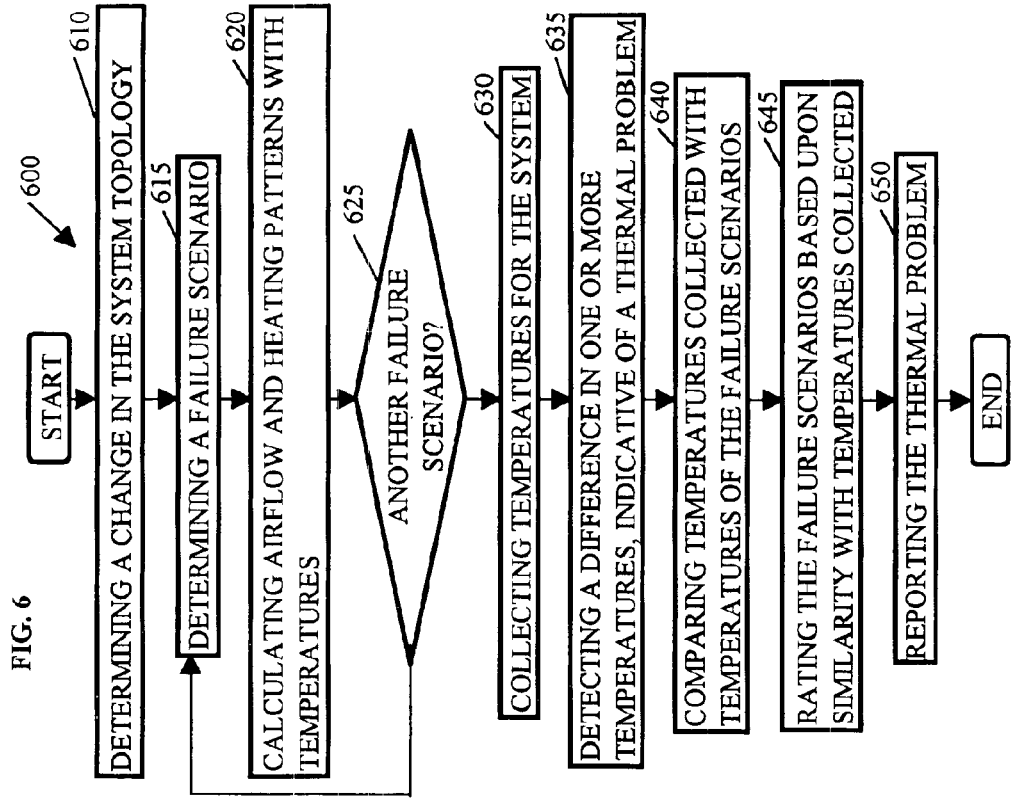
FIG. 6 depicts an example flow chart of a method for thermal analysis of a system when the airflow and heating patterns associated with failure scenarios are determined prior to detecting a thermal problem.

FIG. 6 depicts an example flow chart 600 of a method for thermal analysis of a system when the airflow and heating patterns associated with failure scenarios are determined prior to detecting a thermal problem. Flow chart 600 begins with element 610, determining a change in the system topology. Element 610 may monitor sensors and/or communication channels within the system that indicate the presence of an element such as a server, a panel, a switch module, a fan, and the like. When a new element is introduced to the system or an element is removed from the system, element 610 detects the change to facilitate calculations of airflow and heating patterns associated with the revised system topology. In many embodiments, the current system topology may be revised along with the corresponding calculations to determine the revised airflow and heating patterns.

After the expected airflow and heating patterns are determined for the revised system topology (now the current system topology), a failure scenario is anticipated by modifying the now current system topology via element 615. Element 615 may select a modification from a list of modifications stored in memory such as revising the heat dissipation of a processor, the ambient temperature at an intake vent, the airflow through an element of the system, an airflow loop associated with one or more airflow channels in the system, and other potential modifications and combinations of these modifications.

Once the failure scenario is developed, the airflow and heating patterns for the failure scenario are determined in element 620. For instance, airflow impedances and airflows of the current system topology may be modified and temperatures and/or temperature gradients in and out of elements for the modified current system topology may be calculated.

When calculations for a failure scenario are completed and other potential failure scenarios exist but have not yet been calculated, a subsequent failure scenario may be determined via element 625. In some embodiments, the determination of failure scenarios may be prioritized since a thermal problem may develop while performing calculations for the failure scenarios. For example, failure scenarios for 75 percent blockage of vents, overheating processors, changes in the ambient room temperature of the enclosure and failure of a blower, or fan, may be determined prior to determining failure scenarios for 10 percent blockage of vents due to the severity of the root cause(s) of the thermal problem. In several embodiments, the priority for determining failure scenarios may also be based upon the level of accuracy provided by certain groups of failure scenarios.

When a thermal problem is detected, temperatures for the system are collected in element 630 to facilitate analysis of the thermal problem. In many embodiments, when the temperature changes do not indicate a severe and/or immediate problem, a second set of temperatures may be collected prior to determining the probable source of the thermal problem to provide additional or more accurate estimates of temperature gradients. The temperature gradients may be developed based upon temperature readings prior to detection of the thermal problem and/or by temperature readings subsequent to first detection of the thermal problem in element 630. In particular, element 630 may determine the difference of individual temperature readings and/or gradients and the expected temperatures and/or gradients for the system when properly functioning.

In element 640, the differences of individual temperature readings and/or gradients and the expected temperatures and/or gradients for the system when properly functioning are compared to the differences anticipated by the failure scenarios developed. In several of these embodiments, a separate mechanism is not necessary to determine that a thermal problem exists. A continuous or substantially continuous "acquire and match" approach may report that the system is operating properly when a scenario for a properly functioning system (an "all is well" scenario) most closely matches the observed temperatures. At some point, after a thermal problem begins to develop, the temperatures will begin to change until the "all is well" scenario no longer provides the closest match or one of the closest matches when comparing the "all is well" scenario with a scenario for, e.g., an overheating processor in the server in slot seven. Further, even when the observed temperatures do not indicate that a failure scenario has temperatures that more closely match the observed temperatures, changes in the differences between the temperatures for the "all is well" scenario and observed temperatures and/or temperatures associated with other scenarios may be used a factor in predicting the development of a thermal problem. In some of these embodiments, an alarm such as an indicator light, printout, email, or the like, may provide notice that a thermal problem is or may be developing. As the thermal problem develops further, the thermal problem may be identified.

In some embodiments, when the number of failure scenarios determined are inadequate to determine the probable source of a thermal problem with sufficient accuracy, further failure scenarios may be developed prior to determining the probable source of the thermal problem. The number of failure scenarios necessary for adequate determination of the thermal problem may be based upon whether, e.g., the failure scenarios of the highest priority group of failure scenarios have been determined. In other embodiments, the thermal problem may be analyzed to the degree of accuracy possible with the current group of failure scenarios.

Element 640 may compare the differences of individual temperature readings and/or gradients against the temperatures and/or gradients for the failure scenarios to determine a group of likely scenarios, or scenarios that evidence similar patterns of temperatures and/or temperature gradients. For example, when a failure scenario evidences a high temperature reading near one sensor but the actual temperature reading for that sensor has not varied or has changed very little from the expected temperature reading for the sensor, the corresponding failure scenario may be eliminated from consideration as improbable. In other embodiments, airflow sensors may provide additional information regarding the likelihood of a failure scenario.

After selecting a group of potential failure scenarios, the degree of similarity between the actual temperature readings and the temperatures anticipated by the failure scenario is determined for each failure scenario in the selected group to rate the failure scenarios (element 645). For example, the differences between the temperatures and/or temperature gradients associated with the actual temperature reading and the temperatures and/or temperature gradients associated with the failure scenario may be squared and summed and the square root of the sum may associate the failure scenario with a figure of merit. Then the failure scenario(s) having the figure of merit indicating the highest degree of similarity between the possible failure scenarios is determined to be the most probable failure scenario and the root cause(s) of the most probable failure scenario are reported to a service provider in element 650.

One embodiment of the invention is implemented as a machine-accessible medium for use with a thermal analysis system such as, for example, system 100 shown in FIG. 1 and described below. The program(s) of the machine-accessible medium defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive; magnetic disk storage media; optical storage media; and flash memory devices); and (iii) information conveyed to a computer by a communications medium, such as through a computer or telephone network, including wireless communications such as electrical, optical, acoustical or other form of propagated signals (e.g. carrier waves, infrared signals, digital signals, etc.). The latter embodiment specifically includes information downloaded from the Internet and other networks. Such signal-bearing media, when carrying machine-accessible instructions that direct the functions of the present invention, represent embodiments of the present invention. Some embodiments of the present invention can include more than one machine-accessible medium depending on the design of the machine.

In general, the routines executed to implement the embodiments of the invention, may be part of an operating system or a specific application, component, program, module, object, or sequence of instructions. The program(s) of the present invention typically are comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates involve methods, systems, and media for thermal analysis of a system including multiple elements like servers having interdependent thermal profiles. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method, comprising:
   receiving temperatures associated with elements of a system, wherein the temperatures received are dependent upon airflow and heating patterns of the elements;
   detecting a difference between the temperatures received and expected temperatures; and
   determining potential airflow and heating patterns associated with an element of the elements, the potential airflow and heating patterns being substantially consistent with the temperatures received, to identify the element as a probable source of the difference.

2. The method of claim 1, further comprising adjusting an operation of the system to modify a temperature gradient of the system in response to identifying the element as a probable source of the difference.

3. The method of claim 1, further comprising:
   determining a failure scenario having a change in a system topology associated with the difference and
   calculating airflow and heating patterns for the failure scenario.

4. The method of claim 1, wherein determining the difference comprises accessing the expected airflow and heating patterns stored in memory, the expected airflow and heating patterns being selected based upon a topology of the system.

5. The method of claim 1, wherein determining the difference comprises calculating the expected airflow and heating patterns based upon a topology of the system substantially contemporaneous with the temperatures received.

6. The method of claim 1, wherein determining the difference comprises identifying a temperature gradient associated with a temperature of the temperatures received.

7. The method of claim 1, wherein determining the difference comprises identifying a temperature of the temperatures received that exceeds a threshold temperature.

8. The method of claim 1, wherein determining the potential airflow and heating patterns for the element comprises selecting a failure scenario associated with temperatures, based upon the temperatures received and a topology of the system.

9. The method of claim 1, wherein determining the potential airflow and heating patterns for the element comprises:
   determining a failure scenario based upon a topology of the system;
   calculating the potential airflow and heating patterns for the failure scenario; and
   comparing temperatures associated with the potential airflow and heating patterns against the temperatures received.

10. The method of claim 9, further comprising selecting the failure scenario from a group of failure scenarios to identify the probable source, based upon a similarity between the temperatures associated with the potential airflow and heating patterns and the temperatures received.

11. The method of claim 9, wherein calculating the potential airflow and heating patterns comprises calculating the potential airflow and heating patterns based upon an airflow loop via an opening associated with the element.

12. An apparatus, comprising:
   temperature sensors to detect temperatures dependent upon airflow and heating patterns of elements within an enclosure of a system;
   a temperature monitor coupled with the temperature sensors to receive the temperatures and to detect a difference between the temperatures received and expected temperatures; and
   a failure determiner coupled with the temperature monitor to determine potential airflow and heating patterns associated with an element of the elements, the potential airflow and heating patterns being substantially consistent with the temperatures received, to identify the element as a probable source of the difference.

13. The apparatus of claim 12, further comprising an operation adjuster coupled with the failure determiner to adjust an operation of the system to modify a temperature gradient of the system in response to identifying the element as a probable source of the difference.

14. The apparatus of claim 12, further comprising a topology adjuster coupled with the failure determiner to adjust a topology of the system in response to changing the element.

15. The apparatus of claim 12, wherein the temperature monitor comprises an expected temperature determiner to calculate the expected airflow and heating patterns based upon a topology of the system.

16. The apparatus of claim 12, wherein the failure determiner comprises a scenario selector coupled with memory to select a failure scenario associated with temperatures, based upon the temperatures received and a topology of the system, the topology being substantially contemporaneous with the temperatures received.

17. The apparatus of claim 12, wherein the failure determiner comprises:
   a scenario selector coupled with memory to determine a failure scenario based upon a topology of the system;
   a scenario calculator coupled with the scenario selector to calculate the potential airflow and heating patterns for the failure scenario; and
   a scenario comparator coupled with the scenario calculator to compare temperatures associated with the potential airflow and heating patterns against the temperatures received.

18. The apparatus of claim 17, wherein the scenario calculator comprises a loop calculator to calculate the potential airflow and heating patterns based upon an airflow loop via an opening associated with the element.

19. A machine-accessible medium containing instructions, which when executed by a machine, cause said machine to perform operations, comprising:
   receiving temperatures associated with elements of a system, wherein the temperatures received are dependent upon airflow and heating patterns of the elements;
   detecting a difference between the temperatures received and expected temperatures; and
   determining potential airflow and heating patterns associated with an element of the elements, the potential airflow and heating patterns being substantially consistent with the temperatures received, to identify the element as a probable source of the difference.

20. The machine-accessible medium of claim 19, wherein the operations further comprise adjusting an operation of the system to modify a temperature gradient of the system in response to identifying the element as a probable source of the difference.

21. The machine-accessible medium of claim 19, wherein the operations further comprise:
   determining a failure scenario having a change in a system topology associated with the difference and
   calculating airflow and heating patterns for the failure scenario.

22. The machine-accessible medium of claim 19, wherein determining the potential airflow and heating patterns for the element comprises selecting a failure scenario associated with temperatures, based upon the temperatures received and a topology of the system.

23. The machine-accessible medium of claim 19, wherein determining the potential airflow and heating patterns for the element comprises:
   determining a failure scenario based upon a topology of the system;
   calculating the potential airflow and heating patterns for the failure scenario; and
   comparing temperatures associated with the potential airflow and heating patterns against the temperatures received.

24. The machine-accessible medium of claim 23, wherein calculating the potential airflow and heating patterns comprises calculating the potential airflow and heating patterns based upon an airflow loop via an opening associated with the element.

* * * * *